United States Patent
Iwasaki (10) Patent No.: US 6,486,917 B2
(45) Date of Patent: Nov. 26, 2002

(54) IMAGE-PICKUP APPARATUS, FABRICATION METHOD THEREOF, AND CAMERA SYSTEM

(75) Inventor: Masanori Iwasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/767,977

(22) Filed: Jan. 23, 2001

(65) Prior Publication Data

US 2001/0040639 A1 Nov. 15, 2001

(30) Foreign Application Priority Data

Jan. 27, 2000 (JP) ........................................ 2000-018246
Mar. 31, 2000 (JP) ........................................ 2000-096965

(51) Int. Cl.$^7$ .......................... H04N 5/225; H04N 5/335
(52) U.S. Cl. ..................... 348/375; 348/374; 348/340; 348/294
(58) Field of Search .................... 348/375, 335, 348/340, 294, 374, 241; 257/231, 228, 618

(56) References Cited

U.S. PATENT DOCUMENTS 4,148,051 A * 4/1979 Koike et al. ............... 257/292
5,416,344 A * 5/1995 Ishizuya ..................... 257/228
5,467,204 A * 11/1995 Hatano et al. .............. 348/294
5,589,698 A * 12/1996 Nakashiba .................. 257/231
5,673,083 A * 9/1997 Izumi et al. ................ 348/340
5,880,777 A * 3/1999 Savoye et al. .............. 348/217
6,072,204 A * 6/2000 Blouke et al. .............. 257/231
6,078,359 A * 6/2000 Conder ....................... 348/374
6,122,009 A * 9/2000 Ueda .......................... 348/335
6,208,468 B1 * 3/2001 Togino et al. .............. 359/637
6,285,400 B1 * 9/2001 Hokari ....................... 348/374

FOREIGN PATENT DOCUMENTS

EP          480616 A2 *  4/1992  ............. G03F/7/20

* cited by examiner

Primary Examiner—Tuan Ho
Assistant Examiner—Lin Ye
(74) Attorney, Agent, or Firm—Sonnenschein, Nath & Rosenthal (57) ABSTRACT

An image-pickup apparatus includes an image-pickup device having a flexible shape characteristic; and a retaining member for retaining the image-pickup device in a state being curved in the thickness direction. The image-pickup apparatus is capable of suitably correcting a lens aberration occurring in an imaging optical system.

1 Claim, 10 Drawing Sheets

FIG. 15B (BLOW OF AIR)

FIG. 16A

FIG. 16B (SUCTION OF AIR)

IMAGE-PICKUP APPARATUS, FABRICATION METHOD THEREOF, AND CAMERA SYSTEM

RELATED APPLICATION DATA

The present application claims priority to Japanese Applications Nos. P2000-018246 filed Jan. 27, 2000 and P2000-096965 filed Mar. 31, 2000, which applications are incorporated herein by reference to the extent permitted by law.

BACKGROUND OF THE INVENTION

The present invention relates to an image-pickup apparatus including an image-pickup device, a method of fabricating the image-pickup apparatus, and a camera system using the image-pickup apparatus.

In general, image-pickup devices used for image-pickup apparatuses are fabricated by forming image-pickup elements on a semiconductor wafer by semiconductor fabrication processes, and cut the semiconductor wafer into chips. The image-pickup device thus obtained has a flat-plate shape having a large thickness as a whole, and thereby it exhibits a rigid, non-deformable shape characteristic. Further, an image-pickup plane formed on a principal plane of the image-pickup device is planar along the principal plane.

On the other hand, an object is imaged on an image-pickup plane of an image-pickup device through imaging lenses built in an imaging optical system.

Figure 17:
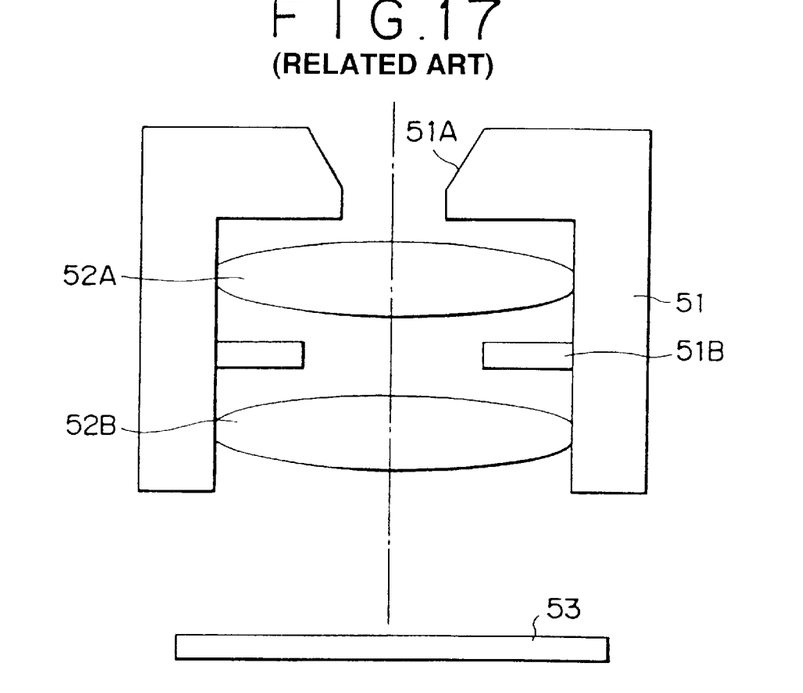
FIG. 17 is a schematic side view showing a state in which a prior art image-pickup device is arranged in combination with an imaging optical system.

FIG. 17 is a schematic side view showing a state in which an image-pickup device is arranged in combination with an imaging optical system. Referring to FIG. 17, a diaphragm portion 51A is integrally formed at the leading end of a lens barrel 51, and two imaging lenses 52A and 52B and an intermediate diaphragm 51B are built in the lens barrel 51. An image-pickup device 53 is arranged relative to the imaging optical system having the above configuration, with the central portion of the image-pickup device 53 aligned to the optical axis (optical center) of the imaging optical system.

Figure 18:
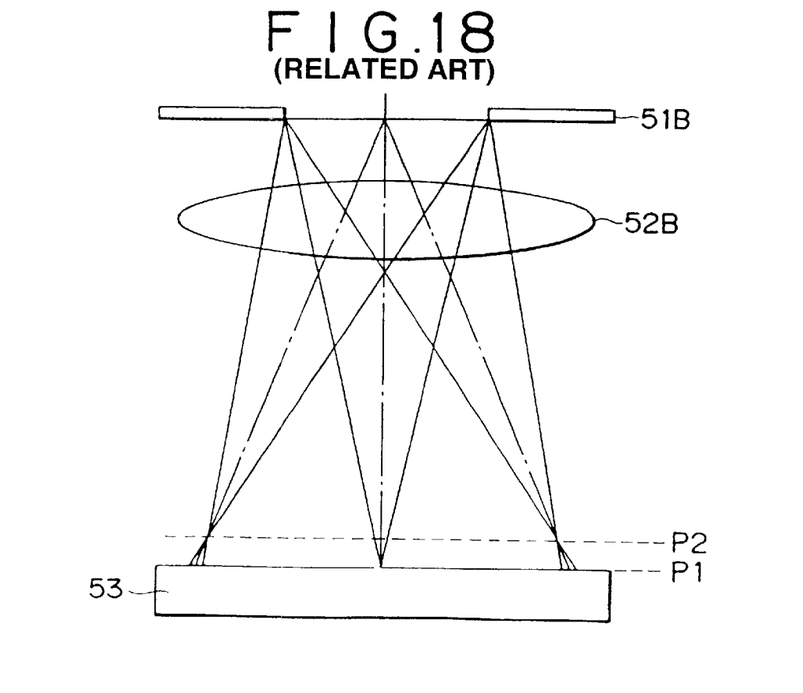
FIG. 18 is a view showing a focusing state of the prior art image-pickup device.

In the case of imaging an object through imaging lenses, there generally occurs a lens aberration called "curvature of field". As shown in FIG. 18, if a focal point is adjusted to P1 at a central portion of the image-pickup device 53, the focal point becomes P2 at a peripheral portion of the image-pickup device 53 by the effect of the above-described curvature of field, to cause a deviation in focal point between the central portion and the peripheral portion of the image-pickup device 53. As a result, there occurs degradation of image-pickup characteristics such as unevenness in image quality between the central portion and the peripheral portion of the image-pickup device 53.

To cope with such an inconvenience, in the case of an imaging optical system having a large number of lenses, a lens aberration occurring in the imaging optical system has been corrected by suitable combination of these lenses, and in the case of an imaging optical system having a small number of lenses, a lens aberration has been corrected by adopting an aspherical lens.

The correction of a lens aberration by an imaging optical system, however, puts a large load on the design of the imaging optical system including lenses, and since the load on the design of the imaging optical system becomes larger with an increase in corrected amount of a lens aberration, the production tolerance of each lens becomes correspondingly stricter. Further, if the amount to be corrected of a lens aberration becomes larger to some extent, there is a possibility that the lens aberration cannot be sufficiently corrected, to thereby cause degradation of image quality.

SUMMARY OF THE INVENTION

An object of the present invention is to provide an image-pickup apparatus allowed to suitably cope with a lens aberration occurring in an imaging optical system, a method of fabricating the image-pickup apparatus, and a camera system using the image-pickup apparatus.

To achieve the above object, according to a first aspect of the present invention, there is provided an image-pickup apparatus including: an image-pickup device having a flexible shape characteristic; and a retaining member for retaining the image-pickup device in a specific shape.

According to a second aspect of the present invention, there is provided a camera system using an image-pickup apparatus, the image-pickup apparatus including: an image-pickup device having a flexible shape characteristic; and a retaining member for retaining the image-pickup device in a specific shape.

According to a third aspect of the present invention, there is provided a method of fabricating an image-pickup apparatus including an image-pickup device having a flexible shape characteristic and a retaining member for retaining the image-pickup device in a specific shape, the method including the step of: making the retaining member retain the image-pickup device in a specific shape by disposing the image-pickup device on the retaining member, and in such a state, blowing air to the image-pickup device from an image-pickup plane side of the image-pickup device or sucking air from the opposed side to the image-pickup plane through the retaining member.

With these configurations of the image-pickup device, the fabrication method thereof, and the camera system using the image-pickup apparatus, since the image-pickup device having a flexible shape characteristic is retained by the retaining member, when the image-pickup device is used in combination with an imaging optical system, a lens aberration occurring in the imaging optical system can be suitably corrected by making the retaining member retain the image-pickup device in a state in which the image-pickup device is curved in the thickness direction.

DETAILED DESCRIPTION OF THE PREFERRED EMBODIMENT

Hereinafter, a preferred embodiment of the present invention will be described in detail with reference to the accompanying drawings.

Figure 1:
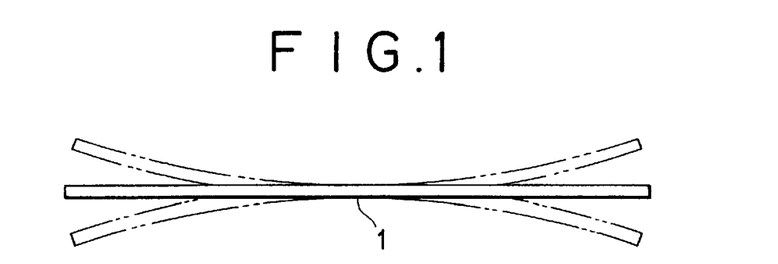
FIG. 1 is a view illustrating a structure of an image-pickup device used for an image-pickup apparatus according to the present invention.

FIG. 1 is a view illustrating a structure of an image-pickup device used for an image-pickup apparatus according to the present invention. As shown in the figure, an image-pickup device 1 is formed in a very thin film structure by a production method to be described later, and has a flexible shape characteristic or freely deformable characteristic as a whole. To achieve such a flexible shape characteristic, the image-pickup device 1 has a thickness (which is a thickness of a semiconductor device) in a range of 100 μm or less, preferably, 50 μm or less, more preferably, 20 μm or less. It should be noted that the thickness of the image-pickup device 1 is the thickness of only a device portion, and therefore, if a flexible resin sheet or the like is stuck on the back surface of the device, the entire thickness becomes the total of the thickness of the semiconductor device and the thickness of the resin sheet or the like.

The image-pickup device 1 can be obtained in accordance with one of known thin film semiconductor fabrication methods proposed by the present applicant, for example, disclosed in Japanese Patent Laid-open Nos. Hei 9-255487, Hei 10-135500, Hei 10-270670, Hei 10-256362, and Hei 11-68133. One example of the production method will be described below.

Figure 2A:
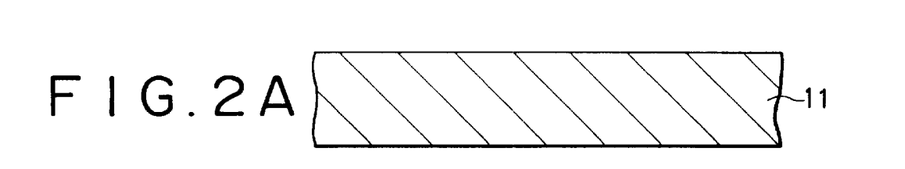
FIGS. 2A to 2D are views illustrating steps of fabricating an image-pickup device according to an embodiment of a fabrication method according to the present invention.

First, as shown in FIG. 2A, a semiconductor substrate 11 made from Si, GaAs, GaP, GaN, SiGe, or the like is prepared. In particular, a wafer shaped substrate made from single crystal Si heavily doped with boron B and having a resistivity of 0.01 to 0.02 Ωcm is preferably used as the semiconductor substrate 11.

The front surface of the semiconductor substrate 11 is subjected to anodic conversion treatment, to form a porous layer including a separation layer on the front surface of the semiconductor substrate 11. The anodic conversion treatment for the semiconductor substrate 11 is performed in an electrolytic solution containing hydrogen fluoride and ethanol, or containing hydrogen fluoride and methanol.

Figure 3:
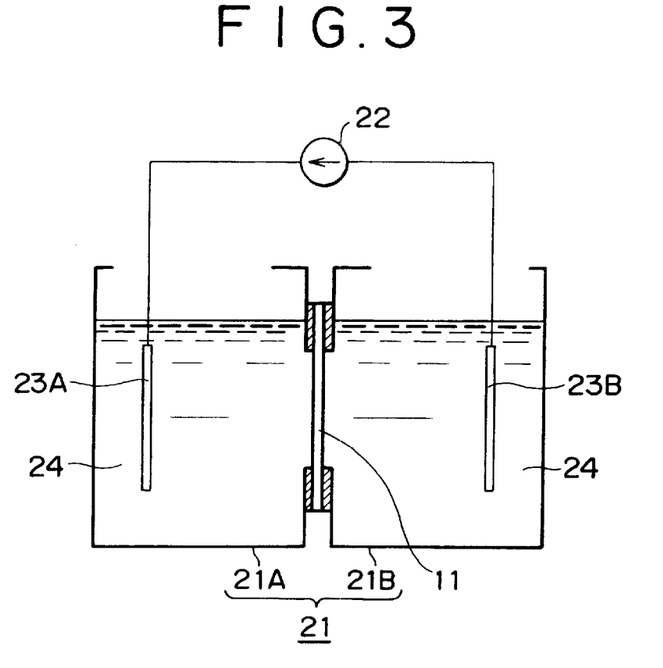
FIG. 3 is a sectional view showing an anodic conversion treatment apparatus used for fabricating an image-pickup device.

The anodic conversion treatment can be performed by a known method, for example, disclosed in Ito, et al., Anodic Conversion treatment for Porous Si, Surface Technology, Vol. 46, No. 5, pp. 8–13, 1995. To be more specific, the anodic conversion treatment can be performed, for example, by a double cell method using double cells schematically shown in FIG. 3. Referring to FIG. 3, there is shown an electrolytic solution cell 21 of a double cell structure having a first cell 21A and a second cell 21B. A semiconductor substrate 11 on which a porous layer is to be formed is disposed between both the cells 21A and 21B, and a pair of platinum electrodes 23A and 23B to which a direct voltage source 22 is connected are put in both the cells 21A and 21B, respectively.

Each of the first and second cells 21A and 21B of the electrolytic solution cell 21 is filled with an electrolytic solution 24 containing hydrogen fluoride HF and ethanol $C_2H_5OH$ or containing hydrogen fluoride HF and methanol $CH_3OH$. The semiconductor substrate 11 is disposed between the first and second cells 21A and 21B with both surfaces of the substrate 11 being in contact with the electrolytic solutions 24 in the first and second cells 21A and 21B, and both the electrodes 23A and 23B are dipped in the electrolytic solutions 24 in the first and second cells 21A and 21B, respectively. The electrode 23A dipped in the electrolytic solution 24 in the first cell 21A on the front surface side of the semiconductor substrate 11 on which a porous layer is to be formed is taken as a negative electrode, and a current is carried from the direct voltage source 22 between both the electrodes 23A and 23B. With this current-carrying, a the semiconductor substrate 11 is taken as an anode side and the electrode 23A is taken as a cathode side, with a result that the front surface, opposed to the electrode 23A side, of the semiconductor substrate 11 is eroded, whereby a porous layer is formed on the front surface of the semiconductor substrate 11.

The double cell method is advantageous in eliminating the need of forming an ohmic electrode on the semiconductor substrate, thereby preventing entrapment of impurities from the ohmic electrode into the semiconductor substrate. It should be noted that the anodic conversion treatment is not necessarily carried out by the double cell method but may be carried out by a single cell method.

According to the present invention, the porous layer to be formed on the surface of the semiconductor substrate is configured to have a plurality of layers different in porosity by repeating the anodic conversion treatment in a plurality of steps, for example, by performing a first anodic conversion treatment at a low current density, a second anodic conversion treatment at a relatively high current density, and a third anodic conversion treatment at a high current density.

Figure 2B:
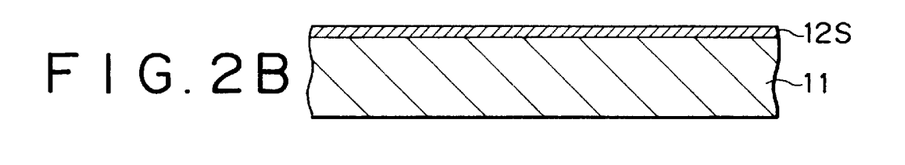
Figure 2C:
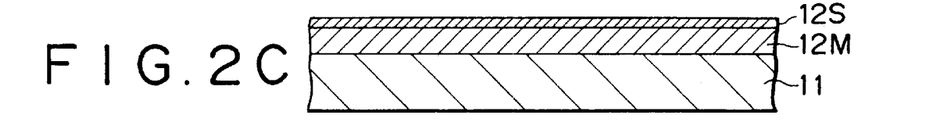

To be more specific, at the first anodic conversion treatment, a current is carried at a low current density of 1 $mA/cm^2$ for 8 min, to form a porous surface layer 12S on the front surface of the semiconductor substrate 11 as shown in FIG. 2B. At the second anodic conversion treatment, the current-carrying is stopped once and then a current is carried at a relatively high current density of 7 mA/cm$^2$ for 8 min, to form an intermediate porosity layer 12M being higher in porosity and larger in pore diameter than the surface layer 12S as shown in FIG. 2C.

Figure 2D:
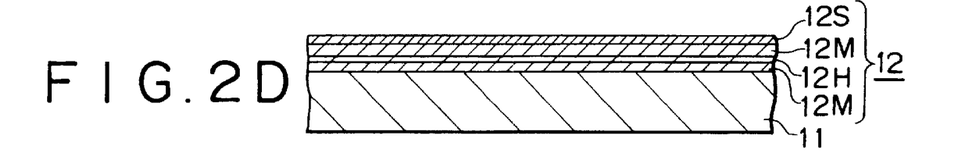

At the third anodic conversion treatment, the current-carrying is stopped once and then a current is carried at a high current density of 80 mA/cm$^2$ for 0.3 sec; the current-carrying is stopped for 1 min and then a current is carried again at the high current density of 80 mA/cm$^2$; and the current-carrying is stopped for 1 min and then a current is carried again at the high current density of 80 mA/cm$^2$, to form a high porosity layer 12H which is higher in porosity than the intermediate porosity layer 12M and which is inserted in the intermediate porosity layer 12M, that is, held between the two-divided parts of the intermediate porosity layer 12M as shown in FIG. 2D. The high porosity layer 12H functions as a separation layer. In this way, the porous layer 12, composed of the stack of the surface layer 12S, the upper intermediate porosity layer 12M, the high porosity layer (separation layer) 12H, and the lower intermediate porosity layer 12M, is formed on the front surface of the semiconductor substrate 11.

The formation of the porous layer 12 including a separation layer on the front surface of the semiconductor substrate 11 is not necessarily performed by the above-described anodic conversion treatment, but may be performed by an ion implantation method.

Subsequently, a semiconductor film for forming the image-pickup device 1 is formed on the semiconductor substrate 11 on which the porous layer 12 has been formed as described above. Prior to the formation of the semiconductor film, the semiconductor substrate 11 on which the porous layer 12 has been formed is put in a normal pressure Si epitaxial growth system, and is annealed in an H$_2$ atmosphere. The annealing is performed by heating the semiconductor substrate 11 from room temperature to 1030° C. for a temperature rising time of about 20 min and keeping the semiconductor substrate 11 at 1030° C. for about 30 min. With this annealing, the front surface of the porous layer 12 is smoothened, and a portion, near the interface between the high porosity layer 12H and each of the intermediate porosity layers 12M, of the high porosity layer 12H becomes weaker, and thereby the high porosity layer 12H becomes a separation layer capable of certainly separating a semiconductor film to be described later from the semiconductor substrate 11.

Figure 4A:
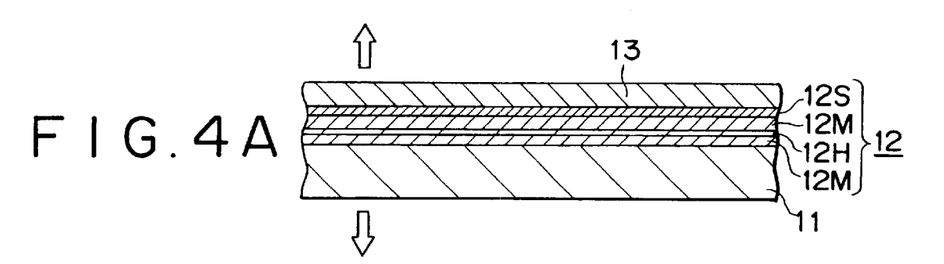
FIGS. 4A and 4B are views illustrating steps of fabricating the image-pickup device, continued from those shown in FIGS. 2A to 2D.

The temperature of the semiconductor substrate 11 is dropped from the annealing temperature of 1030° C. to 1000° C., followed by supply of a SiH$_4$ gas and B$_2$H$_6$ gas in the epitaxial growth system, and Si is epitaxially grown .;q on the semiconductor substrate 11 by a CVD (Chemical Vapor Deposition) process, to form a semiconductor film 13 made from single crystal Si or polycrystalline Si on the surface layer 12S of the porous layer 12 as shown in FIG. 4A. Subsequently, an image-pickup device is formed on the semiconductor film 13 made from Si in accordance with a usual semiconductor fabrication process (for example, a CCD fabrication process).

Figure 4B:
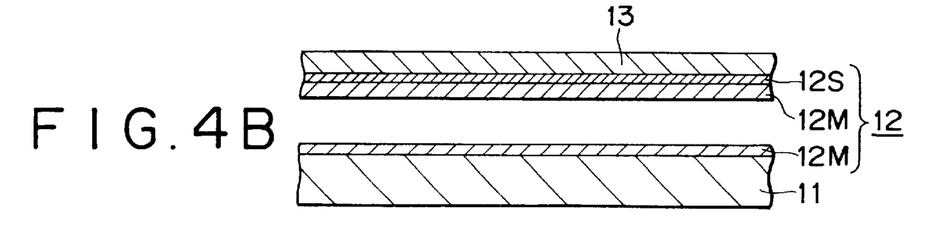

A resin sheet (not shown) is stuck on the semiconductor film 13, on which the image-pickup device has been formed, with an adhesive strength higher than a separation strength of the separation layer 12H of the porous film 12, and then external forces are applied in the directions shown by arrows in FIG. 4A for separating the resin sheet. At this time, the brittle separation layer, that is, the high porosity layer 12H is broken, whereby the semiconductor film 13 is separated (or peeled) from the semiconductor substrate 11 as shown in FIG. 4B.

The surface layer 12S and the intermediate porosity layer 12M of the porous layer 12, remaining on the semiconductor film 13, are removed by etching. In this way, the image-pickup device 1 being very thin and having a flexible shape characteristic, which is shown in FIG. 1, is obtained.

According to the above-described fabrication method of the present invention, after the semiconductor film 13 is separated from the semiconductor substrate 11, the semiconductor substrate 11 is reused, with a result that it is possible to significantly reduce the material cost, save the resource, and reduce the fabrication cost in fabrication of the image-pickup device 1.

Figure 5:
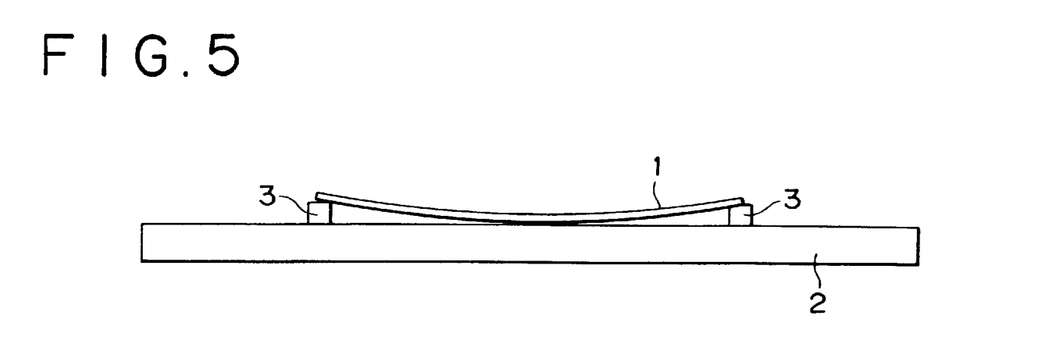
FIG. 5 is a schematic side view showing a first embodiment of an image-pickup device according to the present invention.

FIG. 5 is a schematic side view showing a configuration of an image-pickup apparatus using the image-pickup device 1. As shown in FIG. 5, the image-pickup device 1 is retained by a retaining member 2 with an image-pickup plane (not shown) directed upwardly. The retaining member 2 is a plate-shaped member having an outer dimension larger than that of the image-pickup device 1, which member is made from a metal material, a ceramic material, a resin material, or a composite material thereof.

A plurality of projections 3 are integrally formed on the upper surface of the retaining member 2, or separately formed and joined to the upper surface of the retaining member 2. These projections 3 are provided on the image-pickup device 1 having a rectangular shape in a plan view in such a manner as to be located at four corners of the image-pickup device 1 or located along two opposed sides of the image-pickup device 1.

The image-pickup device 1 is retained by the retaining member 2 in such a manner that the peripheral edge thereof is in contact with the projections 3 and the central portion thereof is in contact with the upper surface of the retaining member 2. In such a state, the image-pickup device 1 is retained in a state being curved in the thickness direction because of the flexible shape characteristic of the image-pickup device 1.

The image-pickup device 1 thus retained is fixed to the retaining member 2 by bonding the image-pickup device 1 to the retaining member 2 at the contact portions such as the projections 3 by using an adhesive. Further, the image-pickup device 1 is retained in a state in which an image-pickup plane (not shown) is curved in a recessed shape. The image-pickup apparatus including these image-pickup device 1 and the retaining member 2 is suitably used for a camera system by combination with an imaging optical system to be described later and further with a signal processing system.

Figure 6:
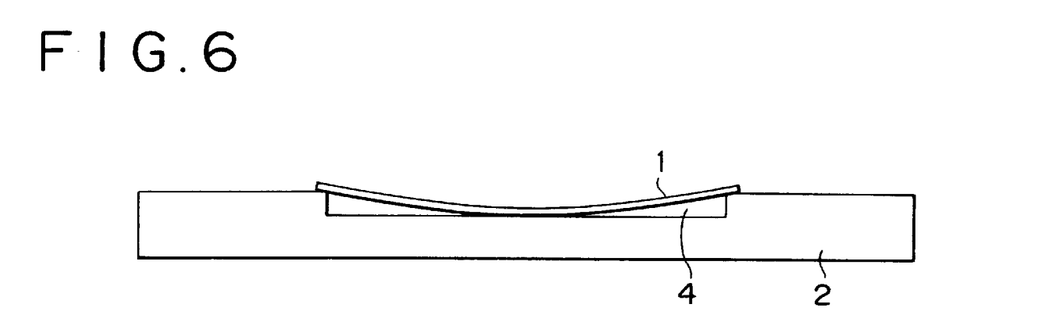
FIG. 6 is a schematic side view showing a second embodiment of the image-pickup device according to the present invention.

In the image-pickup apparatus shown in FIG. 5, the image-pickup device 1 is retained in a state being curved by providing the projections 3 on the upper surface of the retaining member 2; however, the retaining configuration of the image-pickup device 1 is not limited thereto. For example, as shown in FIG. 6, the image-pickup device 1 can be retained in a state being curved by integrally forming a stepped recess 4 in the upper surface of the retaining member 2, and placing the image-pickup device 1 on the retaining member 2 while bringing the image-pickup device 1 into contact with the bottom of the recess 4 and the upper surface of the retaining member 2.

Figure 7:
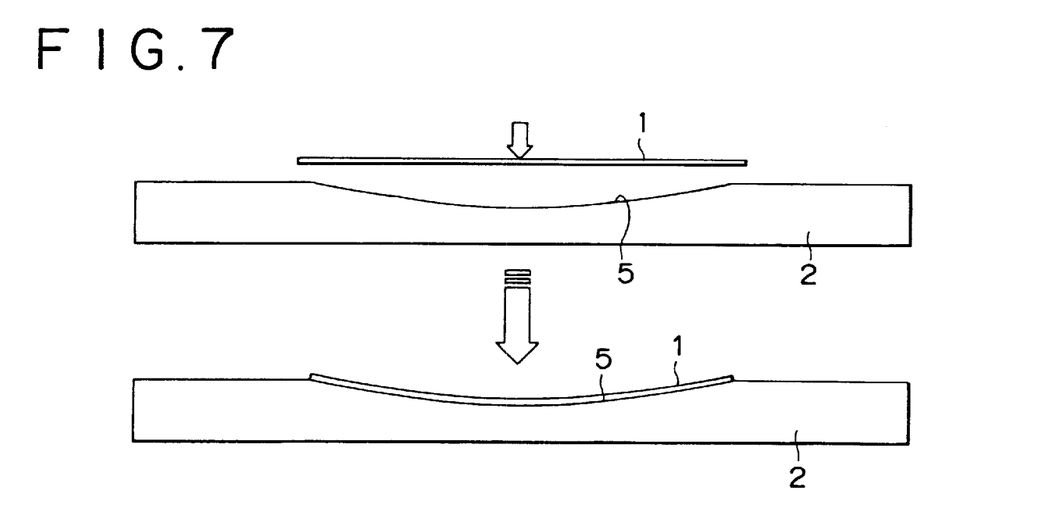
FIG. 7 is a schematic side view showing a third embodiment of the image-pickup device according to the present invention.

Further, as shown in FIG. 7, the image-pickup device 1 can be retained in a state being curved by forming a recessed plane portion 5, which is curved in a recessed shape, in the upper surface of the retaining member 2, and placing the image-pickup device 1 on the retaining member 2 while bringing the back surface (opposed to the front surface, that is, the image-pickup plane) of the image-pickup device 1 uniformly into face-contact with the recessed plane portion 5. In this case, since the image-pickup device 1 is retained in such a manner as to be curved along the shape of the recessed plane portion 5 of the retaining member 2, the curved shape of the image-pickup device 1 in the retained state 4 can be accurately set.

Figure 8:
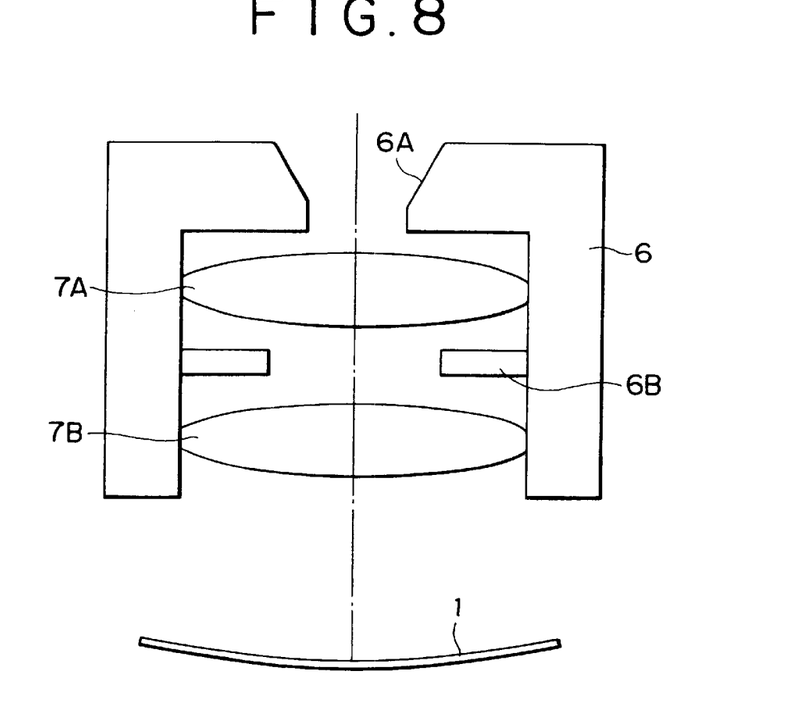
FIG. 8 is a schematic side view showing a state in which the image-pickup device according to the present invention is arranged in combination with an imaging optical system.

FIG. 8 is a schematic side view showing a state in which the image-pickup device of the present invention is arranged in combination of an imaging optical system. As shown in FIG. 8, a diaphragm portion 6A is integrally formed at the leading end of a lens barrel 6, and two imaging lenses 7A and 7B and an intermediate diaphragm portion 6B are built in the lens barrel 6. The image-pickup device 1 is arranged relative to the imaging optical system configured as described above, with the central portion thereof aligned to the optical axis (optical center) of the imaging optical system. The image-pickup plane (not shown) of the image-pickup device 1 is located in such a manner as to form a recessed plane to light rays made incident through the imaging lenses 7A and 7B, and the like.

Figure 9:
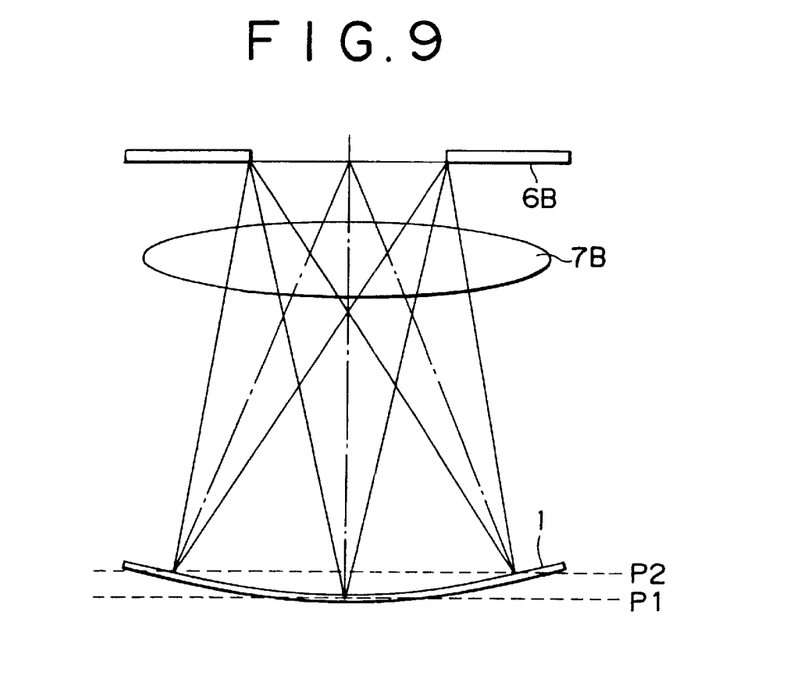
FIG. 9 is a view showing a focusing state of the image-pickup device according to the present invention.

With this arrangement of the image-pickup device 1 in the curved state, a lens aberration occurring in the imaging optical system can be suitably corrected by the image-pickup device 1. To be more specific, as shown in FIG. 9, a focal point P1 (at the central portion of the image-pickup device 1) and a focal point P2 (at the peripheral portion of the image-pickup device 1) of light rays made incident through the intermediate diaphragm portion 6B, the imaging lens 7B, and the like of the imaging optical system are deviated from each other in the direction along the optical axis (vertical direction in FIG. 9) by the effect of the above-described lens aberration. According to the present invention, however, since the image-pickup device 1 is arranged while being curved in correspondence with the deviation in focal point, the central portion of the image-pickup device 1 can be set to the focal point P1 and the peripheral portion of the image-pickup device 1 can be set to the focal point P2.

With this configuration, since focal points of light rays made incident from the imaging optical system can be located overall on the image pickup-plane (not shown) of the image-pickup device 1, it is possible to eliminate the unevenness of image quality due to a deviation in focal point. Also, since a lens aberration occurring in the imaging optical system can be corrected by both the imaging optical system and the image-pickup apparatus, loads on the design and manufacture of the imaging optical system can be significantly reduced as compared with the conventional correction of a lens aberration only by the imaging optical system. Further, even if a lens aberration cannot be sufficiently corrected only by the imaging optical system, it can be sufficiently corrected by combination with the image-pickup apparatus, with a result that it is possible to certainly prevent degradation of image quality due to a lens aberration. since the image-pickup plane is relatively perpendicular to light rays incident from the imaging optical system at the peripheral portion of the image-pickup device 1, the incident angle of light rays at the peripheral portion of the image-pickup device 1 can be made small as compared with a related art image-pickup device. Accordingly, it is possible to make small a reduction in incident light quantity at the peripheral portion of the image-pickup device 1, and to equalize the incident angle of light over the image-pickup device 1 and hence to correct the shading.

The shape of the image-pickup device 1 in the retained state can be freely set in correspondence with an amount to be corrected of a lens aberration occurring in the imaging optical system, and it can be also set in correspondence with an average amount to be corrected of a plurality of lens aberrations in consideration of a variation therebetween. Further, the imaging optical system (including imaging lenses) can be designed in matching with the shape of the image-pickup device 1 in the retained state.

The image-pickup device 1 can be most desirably arranged relative to the imaging optical system by obtaining shape data capable of suitably correcting a lens aberration through simulation based on lens design data, and forming the recessed plane portion 4 shown in FIG. 7 in the upper surface of the retaining member 2 on the basis of the shape data.

Figure 10:
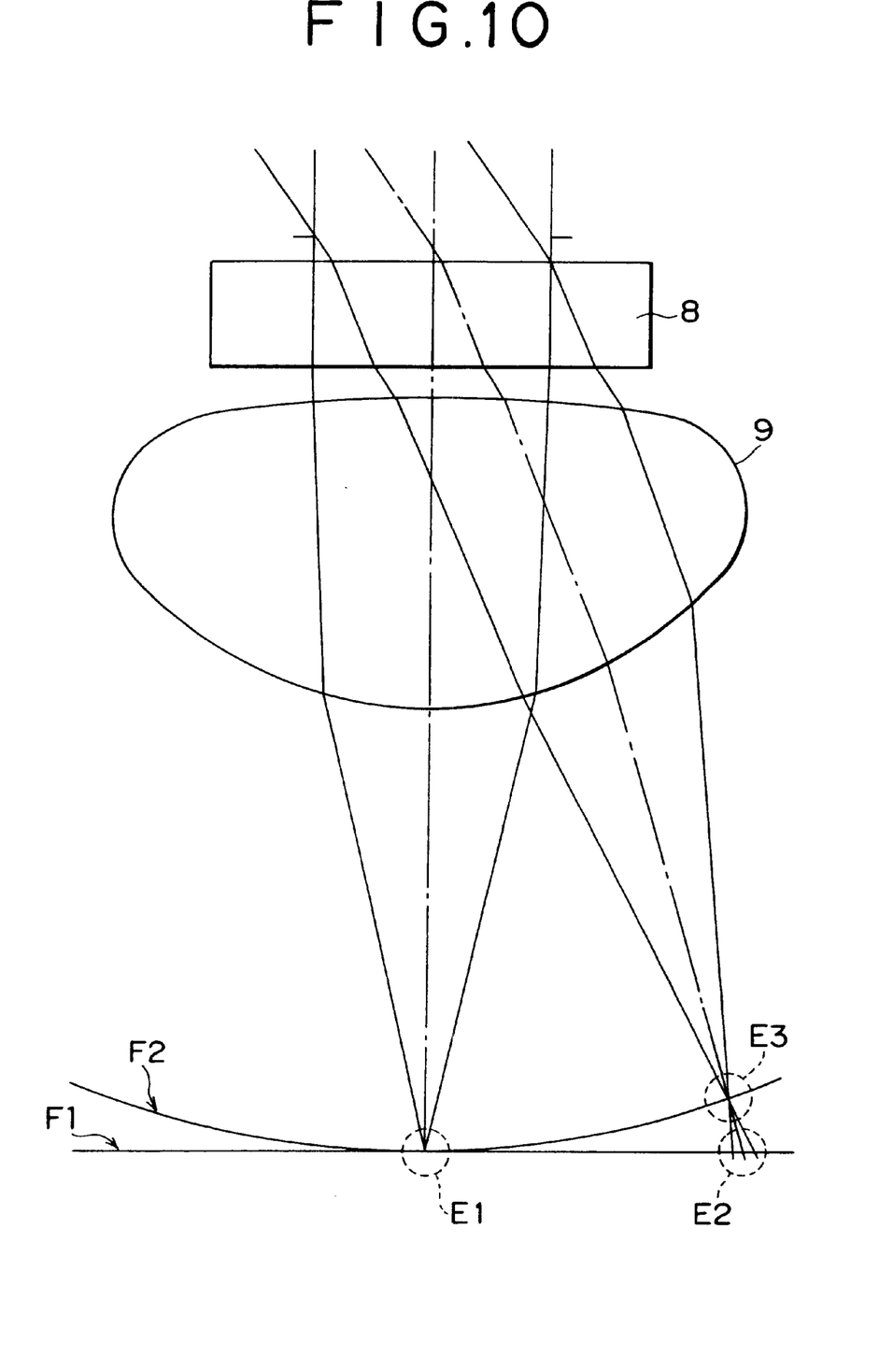
FIG. 10 is a comparative view showing arrangement states of the image-pickup device of the present invention and a prior art image-pickup device relative to an imaging optical system.

FIG. 10 is a comparative view showing a state in which the image-pickup device of the present invention and a related art image-pickup device are arranged in combination with an imaging optical system. In this figure, an optical filter 8 and an imaging lens 9 form an imaging optical system. With respect to the common imaging optical system, the related art image-pickup device is arranged in a flat plane F1 and the image-pickup device of the present invention is arranged in a curved plane F2.

Figure 11A:
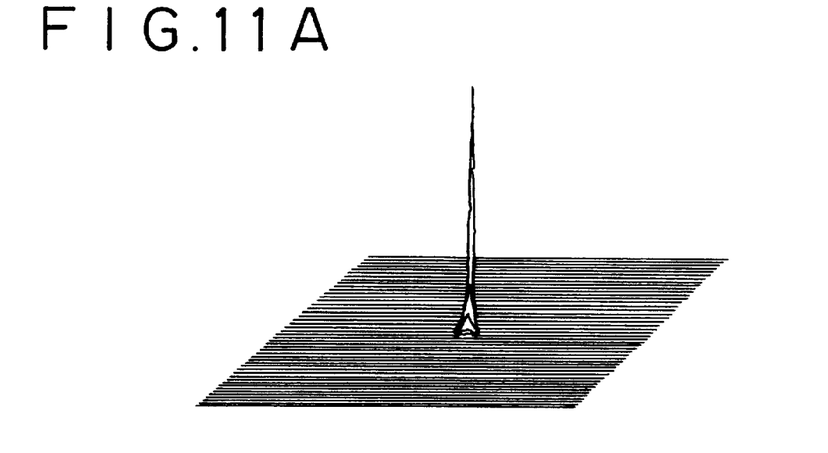
FIGS. 11A to 11C are views showing extensions of point images at E1, E2 and E3 of FIG. 10.

An experiment was made to examine a difference in extension of a point image between both the image-pickup devices arranged as shown in FIG. 10. The experiment was performed by making light rays from the imaging optical system incident on both the image-pickup devices, and examining the extensions of point images at positions E1, E2 and E3 shown in FIG. 10. First, at the position E1 corresponding to the central portion of each of both the image-pickup devices, as shown in FIG. 11A, a steep rise locally appeared, with the extension of the point image sufficiently suppressed.

Figure 11B:
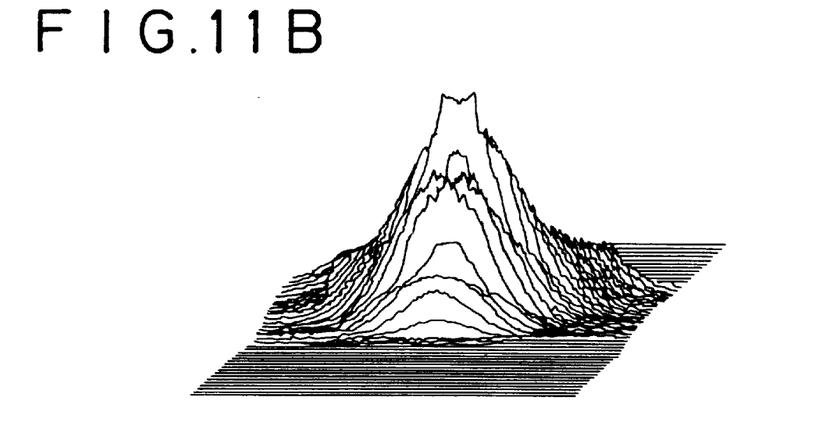
Figure 11C:
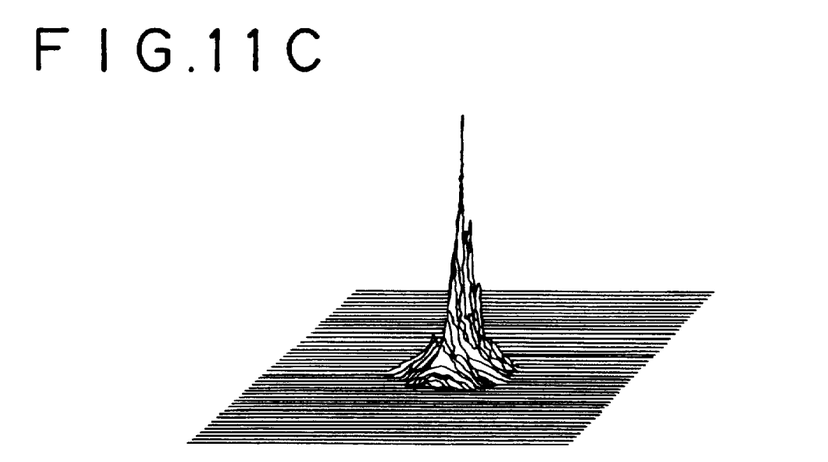

At the position E2 corresponding to the peripheral portion of the related art image-pickup device, as shown in FIG. 11B, a gently-sloping rise appeared, with the point image significantly extended. At the position E3 corresponding to the peripheral portion of the image-pickup device of the present invention, as shown in FIG. 11C, the extension of the point image was slightly larger as that of the point image at the central portion of the image-pickup device; however, it was significantly smaller than that of the point image at the peripheral portion of the prior art image-pickup device.

Figure 12A:
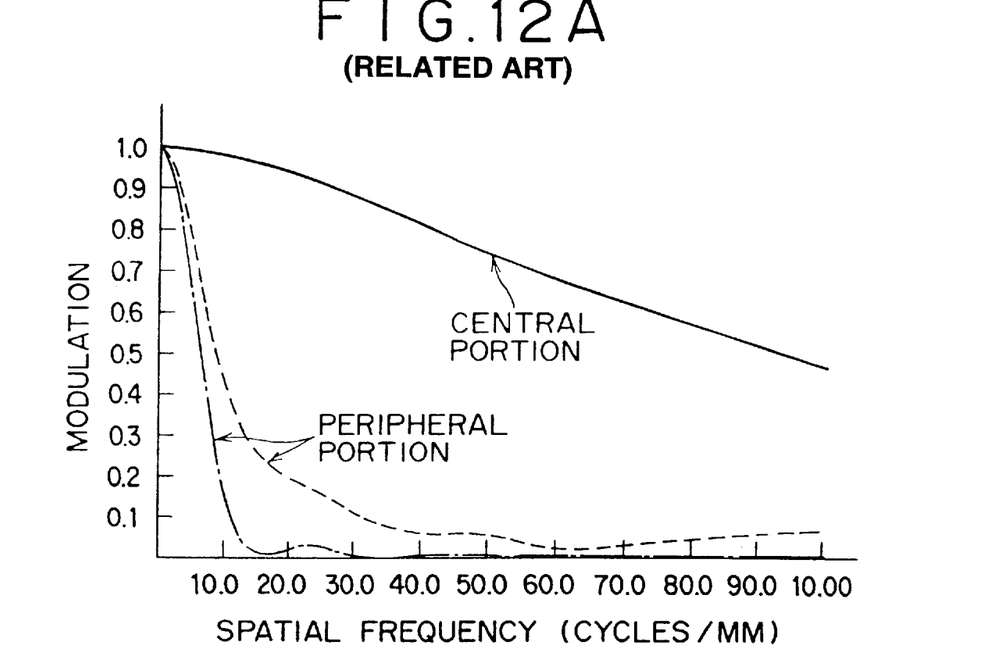
FIG. 12A is a graph showing resolving powers at a central portion and a peripheral portion of a prior art image-pickup device.
Figure 12B:
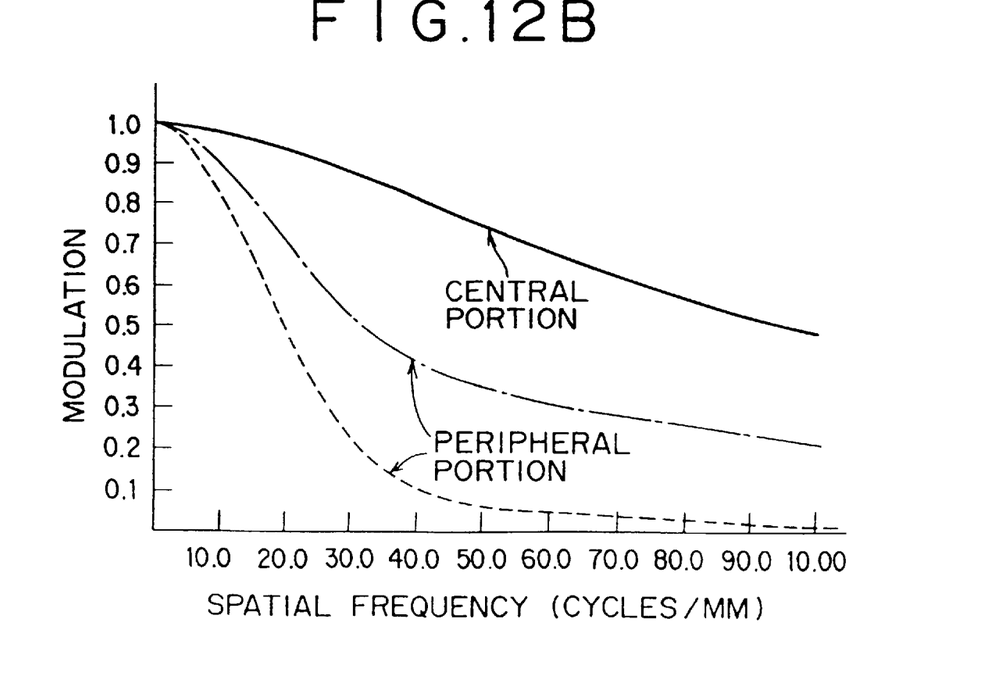
FIG. 12B is a graph showing resolving powers at a central portion and a peripheral portion of the image-pickup device of the present invention.

The resolving power of the image-pickup device of the present invention was compared with that of the related art image-pickup device. The results are shown in FIGS. 12A and 12B. FIG. 12 shows data on the resolving power of the related art image-pickup device, and FIG. 12B shows data on the resolving power of the image-pickup device of the present invention. In these graphs, a solid line shows the resolving power at the central portion of the device (optical center axis); a broken line shows the resolving power in the radial direction at the peripheral portion of the device; and a dash line shows the resolving power in the direction perpendicular to the radial direction at the peripheral portion of the device.

As is apparent from FIGS. 12A and 12B, at the central portion of each of the image-pickup devices, the resolving power is high. On the contrary, at the peripheral portion of the related art image-pickup device, the resolving power is sharply dropped at a relatively low frequency, while at the peripheral portion of the image-pickup device of the present invention, the resolving power is very gently dropped.

From the above-described experimental results, it is confirmed that according to the image-pickup apparatus of the present invention, since the image-pickup device 1 having a flexible shape characteristic is retained in a state being curved in the thickness direction, even if a lens aberration occurs in an imaging optical system, it is possible to minimize the adverse effect of the lens aberration and improve the image-pickup characteristic and hence to realize a high image quality.

Figure 13A:
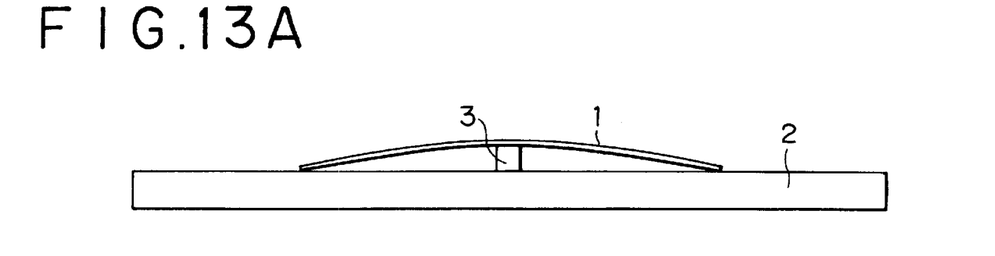
FIGS. 13A and 13B are views illustrating a fourth embodiment of the image-pickup device according to the present invention.

In the above-described embodiments, the image pickup device 1 is retained in such a manner as to be curved in a recessed plane with respect to light rays made incident through an imaging optical system; however, the retaining configuration of the image-pickup device 1 of the present invention is not limited thereto. For example, as shown in FIG. 13A, the image-pickup device 1 can be retained by the retaining member 2 in such a manner as to be curved in a projecting plane with respect to the above-described incident light rays by providing projections 3 on the upper surface of the retaining member 2 and placing the image-pickup device 1 on the retaining member 2 in such a manner that the central portion of the image-pickup device 1 is in contact with the projections 3 and the peripheral portion of the image-pickup device 1 is in contact with the upper surface of the retaining member 2.

Figure 13B:
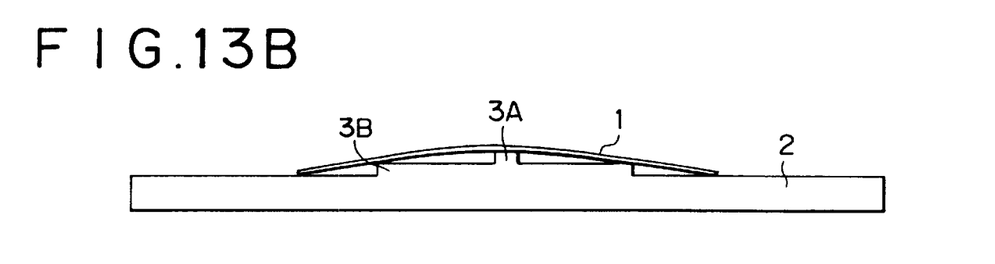

As shown in FIG. 13B, the image-pickup device 1 can be similarly retained by the retaining member 2 in such a manner as to be curved in a projecting plane by providing a first projection 3A and a second projection 3B on the upper surface of the retaining member 2 and placing the image-pickup device 1 on the retaining member 2 in such a manner that the central portion and intermediate portion of the image-pickup device 1 are in contact with the projections 3A and 3B respectively and the peripheral portion of the image-pickup device 1 is in contact with the upper surface of the retaining member 2.

Figure 14A:
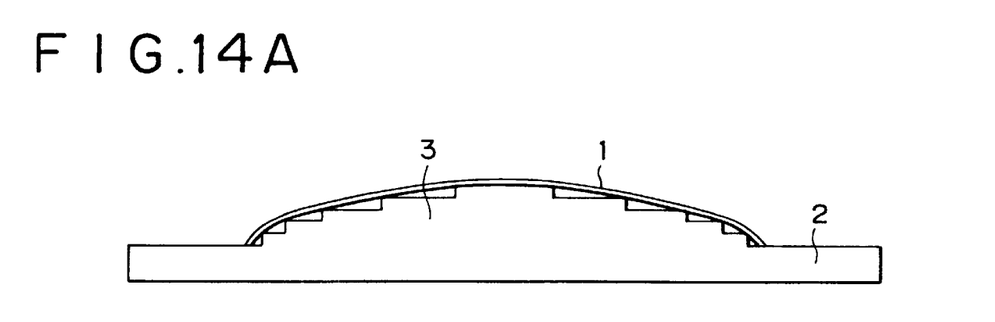
FIGS. 14A and 14B are views illustrating a fifth embodiment of the image-pickup device according to the present invention.

As shown in FIG. 14A, the image-pickup device 1 can be similarly retained by the retaining member 2 in such a manner as to be curved in a projecting plane by providing a stepped projection 3 having a plurality of steps on the upper surface of the retaining member 2 and placing the image-pickup device 1 on the retaining member 2 in such a manner that the image-pickup device 1 is in contact with the steps of the stepped projection 3. Further, as shown in FIG. 14B, the image-pickup device 1 can be retained by the retaining member 2 in such a manner as to be curved in a recessed plane by providing a stepped recess 4 having a plurality of steps in the upper surface of the retaining member 2 and placing the image-pickup device 1 on the retaining member 2 in such a manner that the image-pickup device 1 is in contact with the steps of the stepped recess 4.

Figure 14B:
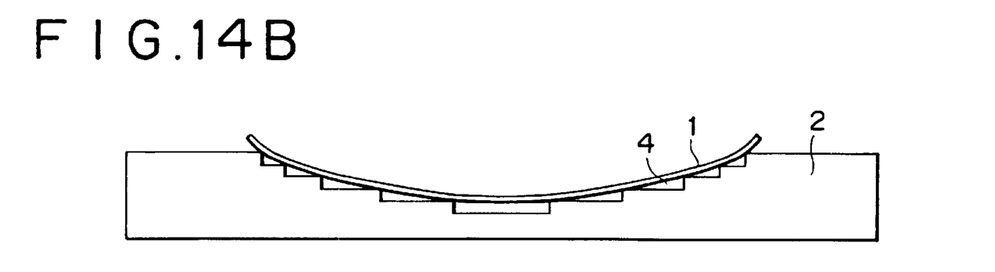

In the above-described retaining structures shown in FIGS. 14A and 14B, each of the steps of the projection 3 and the recess 4 formed on and in the retaining member 2 is formed by a plane parallel to the thickness direction of the retaining member 2 and a plane perpendicular thereto, with a result that the stepped projection 3 or the stepped recess 4 can be easily formed on or in the retaining member 2 by machining and further the image-pickup device 1 can be retained in a projecting or recessed plane closer to the ideal projecting or recessed plane.

In the retaining structure shown in FIG. 7, the recessed plane portion is formed in the upper surface of the retaining member 2; however, a projecting plane portion (not shown), curved in a projecting shape, may be formed on the upper surface of the retaining member 2. In this case, the image-pickup device 1 can be retained in such a manner as to be curved along the projecting plane of the retaining member 2.

The shape of the image-pickup device 1 retained by the retaining member 2 is not limited to a curved shape (for example, recessed or projecting shape), but may be variously changed depending on the application of the image-pickup device 1. For example, by forming two independent image-pickup planes on the principal plane of the image-pickup device 1 and retaining the image-pickup device 1 in an approximately V-shape or an approximately inverse V-shape so as to tilt each image-pickup plane at a specific angle, objects in the different directions can be simultaneously imaged by the same image-pickup device 1.

By the way, in the process of fabricating an image-pickup apparatus using the image-pickup device 1 having a flexible shape characteristic, if the image-pickup device 1 is pressed to the retaining member 2 from the principal plane with a jig in order to be retained by the retaining member 2, the front surface of the image-pickup device 1 may be damaged by the contact with the jig. In particular, since a precise image-pickup plane is present on the principal plane of the image-pickup device 1, if the image-pickup plane is damaged, the function of the image-pickup device 1 may be impaired. Further, if the peripheral portion, around the image-pickup plane, of the image-pickup device is pressed by using pins or the like, since a local pressure is applied to the image-pickup device 1, a wiring portion of the precise image-pickup device 1 may be damaged.

Figure 15A:
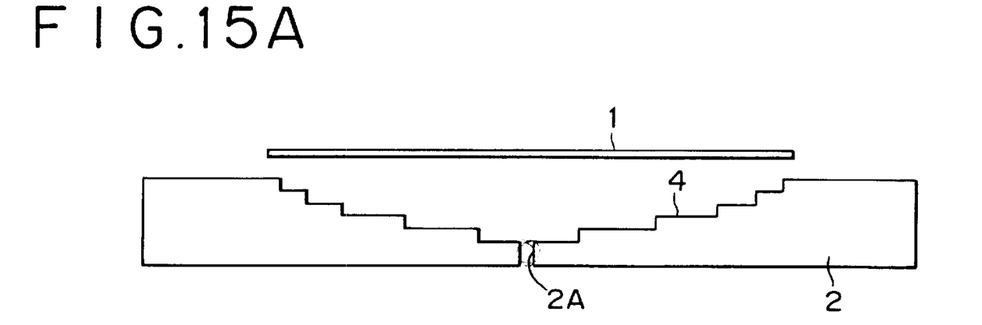
FIGS. 15A and 15B are view illustrating one example of a method of fabricating the image-pickup device according to the present invention.
Figure 15B:
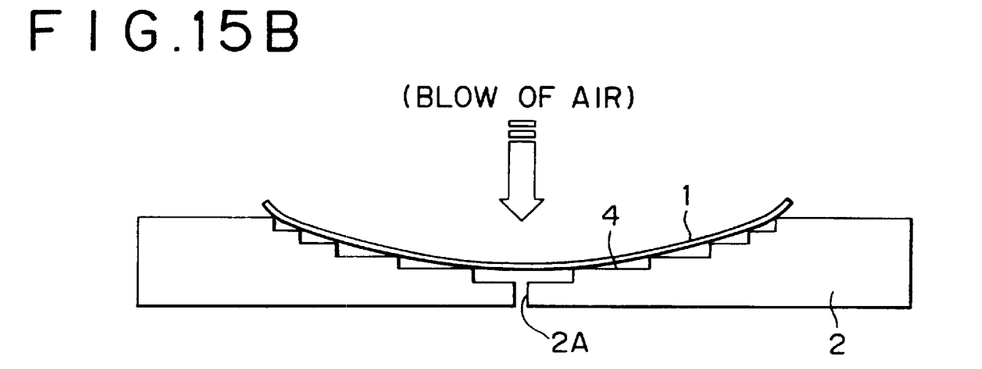

According to the present invention, the image-pickup device 1 is retained on the retaining member by using the following assembling method. For example, in the case of fabricating the image-pickup device shown in FIG. 14B, as shown in FIG. 15A, the image-pickup device 1 is placed over the retaining member 2 in such a manner as to face to the stepped recess 4 and in such a state, as shown in FIG. 15B, air is blown in the direction shown by an arrow, that is, in the direction from the image-pickup plane (upper surface of the device) side to the image-pickup device 1. In this case, air may be blown only to the central portion of the image-pickup device 1, or may be blown to both the central portion and the peripheral portion of the image-pickup device 1.

The blow of air causes an air pressure applied to the image-pickup device 1, so that the image-pickup device 1 is deformed in a state in which the back surface of the device 1 is in contact with the steps of the stepped recess 4. In this case, by providing a communication hole 2A in the bottom surface of the recess 4 of the retaining member 2, air present on the back surface (lower surface) of the image-pickup device 1 can be escaped to the outside through the communication hole 2A, with a result that the air pressure by blow of air can be effectively applied to the image-pickup device 1.

By adopting the assembling method using an air pressure by blow of air, the image-pickup device 1 can be retained on the retaining member 2 in such a manner as to be curved in a recessed shape without pressing the principal plane of the image-pickup device 1 with a jig, and further the image-pickup device 1 can be accurately retained on the retaining member 2 because the image-pickup device 1 can be desirably fitted to the stepped recess 4 formed in the retaining member 2.

The assembling method using an air pressure by blow of air can be also applied to the methods of fabricating the image-pickup devices shown in FIGS. 5 to 7, FIGS. 13A and 13B, and FIG. 14A. Additionally, in the case where the image-pickup device 1 is retained on the retaining member 2 in such a manner as to be curved in a projecting shape as shown in each of FIGS. 13A and 13B, and FIG. 14A, air must be blown to the peripheral portion of the image-pickup device 1, or to both the central portion and the peripheral portion of the image-pickup device 1.

Figure 16A:
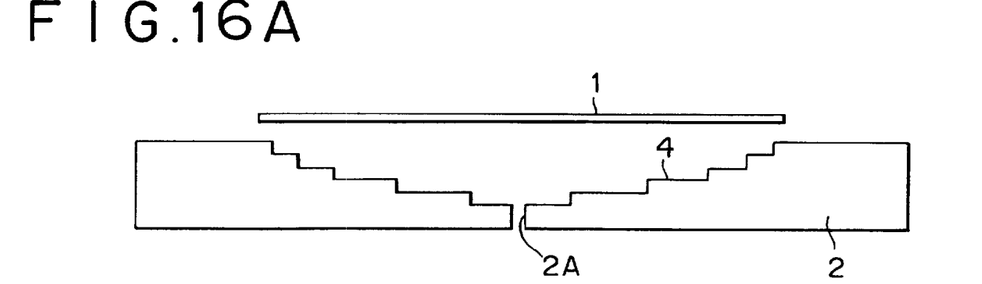
FIGS. 16A and 16B are view illustrating another example of a method of fabricating the image-pickup device according to the present invention.
Figure 16B:
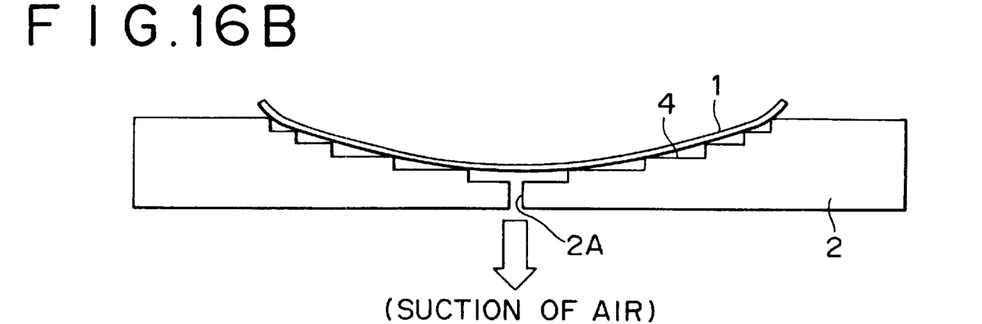

Another assembling method using an air pressure by suction of air will be described below. As shown in FIGS. 16A and 16B, a communication hole 2A is provided in the bottom surface of the recess 4 of the retaining member 2, wherein the image-pickup device 1 is placed over the retaining member 2, and in such a state, air is sucked from the communication hole 2A. In this case, the atmospheric pressure on the back surface side (opposed to the image-pickup plane) of the image-pickup device 1 is reduced by suction of air through the communication hole 2A. As a result, the image-pickup device 1 is deformed with a suction force caused by the reduction in atmospheric pressure.

By adopting the assembling method using an air pressure by suction of air, the image-pickup device 1 can be retained on the retaining member 2 in such a manner as to be curved in a recessed shape without pressing the principal plane of the image-pickup device 1 with a jig, and further the image-pickup device 1 can be accurately retained on the retaining member 2 because the image-pickup device 1 can be desirably fitted to the stepped recess 4 formed in the retaining member 2.

The assembling method using an air pressure by suction of air can be also applied to the methods of fabricating the image-pickup devices shown in FIGS. 5 to 7.

As described above, according to the present invention, since the image-pickup device having a flexible shape characteristic is retained by the retaining member in a specific shape curved in the thickness direction, when the image-pickup apparatus is used in combination with an imaging optical system, a lens aberration occurring in the imaging optical system can be suitably corrected by the image-pickup apparatus, with a result that it is possible to significantly reduce loads on the design and manufacture of the imaging optical system (particularly, imaging lenses), and to certainly prevent degradation of image quality due to a lens aberration.

While the preferred embodiments of the present invention have been described using the specific terms, such description is for illustrative purposes only, and it is to be understood that changes and variations may be made without departing from the spirit or scope of the following claims.

What is claimed is:

1. A method of fabricating an image-pickup apparatus including an image-pickup device having a flexible shape characteristic and a retaining member for retaining the image-pickup device in a specific shape, said method comprising the step of:

making the retaining member retain the image-pickup device in a specific shape by disposing the image-pickup device on the retaining member, and in such a state, blowing air to the image-pickup device from an image-pickup plane side of the image-pickup device or sucking air from the opposed side to the image-pickup plane through the retaining member.

* * * * *